United States Patent
Hoke et al.

(10) Patent No.: US 6,368,983 B1
(45) Date of Patent: Apr. 9, 2002

(54) MULTI-LAYER WAFER FABRICATION

(75) Inventors: William E. Hoke, Wayland; Peter S. Lyman, Mendon; John J. Mosca, Carlisle, all of MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/291,577

(22) Filed: Apr. 9, 1999

(51) Int. Cl.⁷ ............................................. H01L 21/31
(52) U.S. Cl. .................. 438/761; 438/763; 438/799; 438/602; 117/108
(58) Field of Search ....................... 438/761, 763, 438/799, 602, 603, 604; 117/108, 105, 107

(56) References Cited

U.S. PATENT DOCUMENTS

| | | | |
|---|---|---|---|
| 4,939,102 A | * 7/1990 | Hamm et al. | 117/105 |
| 5,094,974 A | * 3/1992 | Grunthaner et al. | 117/105 |
| 5,399,521 A | * 3/1995 | Celii et al. | 117/108 |
| 5,456,205 A | 10/1995 | Sheldon | 117/85 |
| 5,556,462 A | * 9/1996 | Celii et al. | 117/84 |
| 5,762,706 A | 6/1998 | Saito et al. | 117/105 |
| 5,989,339 A | 11/1999 | Tamamura et al. | 117/107 |

* cited by examiner

*Primary Examiner*—Kevin M. Picardat
(74) *Attorney, Agent, or Firm*—Daly, Crowley & Mofford, LLP

(57) ABSTRACT

The invention provides a method of fabricating a wafer including growing a single crystal layer comprising a III-V compound in a first chamber at a temperature above 350° C. A temperature of a surface of the single crystal layer is reduced to below about 350° C. in the first chamber. An indium arsenide layer is deposited on the single crystal layer, to form an intermediate structure, in the first chamber at a temperature below 350° C. and above 100° C. The intermediate structure is transferred to a second chamber. A surface of the intermediate structure is heated to a temperature above about 600° C. to remove substantially all of the indium arsenide layer and impurities collected in the indium arsenide layer during the transfer to the second chamber. Another material is deposited on the single crystal layer in the second chamber.

19 Claims, 2 Drawing Sheets

MULTI-LAYER WAFER FABRICATION

BACKGROUND OF THE INVENTION

This invention relates generally to methods for growing layers on wafers and more particularly to growing layers of different materials in different growth chambers.

As is known in the art, wafers such as semiconductor wafers can have advanced layer structures that incorporate several different materials. Typically, these structures are accomplished by depositing the layers on the wafer in one growth apparatus or chamber such as a molecular beam epitaxy (MBE) machine. There are, however, situations where forming these layers in one chamber is undesirable. In one situation, background cross contamination of layers is possible. For example, if a III-V layer and a II-VI layer are grown in one chamber, then the high vapor pressure of group V elements (i.e., elements in group V of the Periodic Table, e.g., Arsenic As, and Phosphorus P) can unintentionally dope the II-VI film and contaminate the II-VI furnaces. Arsenic in a first-deposited layer can evaporate and undesirably combine with elements for a second-deposited layer. The high vapor pressure group VI elements (e.g., Sulfur S, Selenium Se, and Tellurium Te) can also contaminate the III-V film and can contaminate III-V furnaces. Another undesirable situation is when different capabilities are required for growing different layers. For example, equipment limitations may prevent one chamber from growing different layers that require, e.g., different temperatures. Also, undesirable amounts of time and/or money may be necessary to establish different capabilities for growing two different layers in one growth chamber.

The problems associated with growing different material layers in one growth chamber mean that it is often desirable, if not required, to use different growth chambers to grow layers of different materials on a wafer. In this case, one layer is grown in one chamber and the wafer is transferred to a second chamber to grow the second layer on the wafer. This typically requires exposing the wafer to the atmosphere during transfer between chambers, although in rare cases chambers are connected by vacuum tubes. Exposure to the atmosphere causes significant surface contamination that cannot be eliminated by subsequent wafer outgassing in the second growth chamber.

To prevent contamination of the wafer surface when transferring the wafer between chambers, the wafer surface can be coated with a protective layer. In this case, a first layer is deposited on the wafer in a first chamber. Then, for example, an arsenic protective layer is deposited over the first layer in the first chamber. The wafer is removed from the first chamber and transported to a second chamber where the arsenic layer is removed (i.e., desorbed) by heating the wafer. With the arsenic protective layer substantially removed, a second layer is deposited over the first layer on the wafer. Using this technique has the advantage that atmospheric contamination is prevented when transferring the wafer from the first chamber to the second chamber.

Using an arsenic protective layer when transferring the wafer between chambers, however, has several disadvantages. Arsenic does not begin to adsorb onto some surfaces, e.g., semiconductor surfaces, until the wafer temperature is below 100° C. Therefore the wafer temperature must be cooled to below 100° C. from temperatures of 560° C. and higher used when depositing the layer to be protected, requiring cooling times of an hour or more. During this lengthy cooldown period, the wafer surface can be contaminated from materials present in the chamber. For reactive surfaces such as aluminum gallium arsenide, background contamination during cooldown is also a significant problem. Additionally, if the layer to be protected by the arsenic protective layer includes arsenic, then arsenic is supplied to the surface of the wafer during cooldown to replace arsenic that evaporates from the wafer surface. Supplying arsenic during the lengthy cooldown thus increases the arsenic consumption. Still more time, e.g., 20 minutes, is required to deposit the arsenic protective layer on the wafer. Also, arsenic often does not bond strongly to the wafer surface, which allows the arsenic to flake off if the wafer is vibrated or bent during handling when being transferred between chambers.

SUMMARY OF THE INVENTION

In general, in one aspect, the invention provides a method of fabricating a wafer including growing a single crystal layer comprising a III-V compound in a first chamber at a temperature above 350° C. A temperature of a surface of the single crystal layer is reduced to below about 350° C. in the first chamber. An indium arsenide layer is deposited on the single crystal layer, to form an intermediate structure, in the first chamber at a temperature below 350° C. and above 100° C. The intermediate structure is transferred to a second chamber. A surface of the intermediate structure is heated to a temperature above about 600° C. to remove substantially all of the indium arsenide layer and impurities collected in the indium arsenide layer during the transfer to the second chamber. Another material is deposited on the single crystal layer in the second chamber.

With such an arrangement, impurities collected by the wafer during transfer between chambers can be removed, while requiring less time to deposit a protective layer on the wafer than if an arsenic-only protective layer is deposited on the wafer.

In general, in another aspect, the invention provides a method including depositing a layer of a first material on a single crystal substrate in a first chamber. A second material is deposited in the first chamber over a surface of the layer at a temperature above 100° C., the second material including one or more elements each of which is in a Periodic Table group of an element in the first material. The second material is heated in a second chamber to substantially remove the second material.

Embodiments of the invention may have the first material include a III-V compound and the second material include indium arsenide.

In general, in another aspect, the invention provides a method of processing a wafer and protecting the wafer from impurities. The method includes growing a III-V layer in a first chamber on a substrate. An indium arsenide layer is deposited on the III-V layer in the first chamber. The indium arsenide layer is heated in a second chamber to desorb the indium arsenide layer. Another layer is grown on the III-V layer in the second chamber.

Embodiments of the invention may have the second temperature lower than the first temperature and above 100° C.

In general, in another aspect, the invention provides a method of fabricating a wafer, the method including growing a single crystal layer including a III-V compound in a first chamber at a first temperature over a substrate. An indium arsenide layer is deposited over the single crystal layer, to form an intermediate structure, in the first chamber at a second temperature lower than the first temperature and above 100° C. The intermediate structure is transferred to a second chamber where the indium arsenide layer is desorbed at a third temperature greater than the second temperature.

Various embodiments of the invention may provide one or more of the following advantages. For gallium arsenide growth at about 560° C., less than 10 minutes of cooling time can be used prior to applying a protective coating of e.g., indium arsenide. In situ gettering of contamination can be significantly reduced compared to conventional means. A 50 Å layer of indium arsenide can be applied as a protective coating in less than one minute. Throughput of wafers can be maintained while providing an indium arsenide protective coating for transit between chambers. Reduced amounts of arsenic can be consumed during cooling prior to applying a protective coating compared to applying arsenic protective layers. A protective coating of, e.g., indium arsenide can be applied to gallium arsenide layers, for protection during transit between chambers, that bonds better to the gallium arsenide than an arsenic protective coating.

BRIEF DESCRIPTION OF THE DRAWINGS

Other features and advantages of the invention, as well as the invention itself, will become more readily apparent when taken together with the following detailed description and the accompanying drawings, in which.

DESCRIPTION OF PREFERRED EMBODIMENTS

Figure 1:
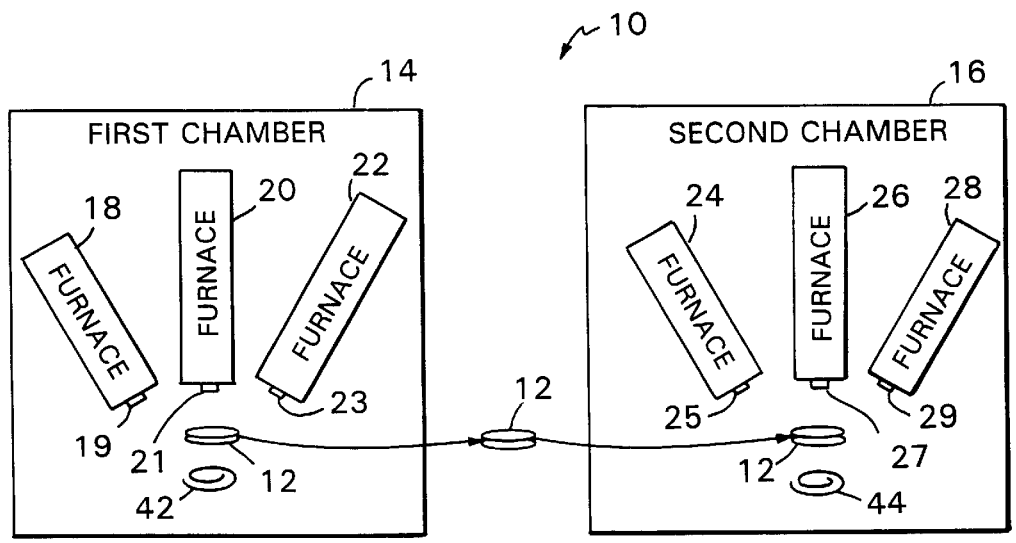
FIG. 1 is a simplified schematic block diagram of a wafer in transit between two deposition chambers each containing three furnaces.

Referring to FIG. 1, a system 10 for forming a wafer 12 includes a first chamber 14 and a second chamber 16. Each of the chambers 14 and 16 include several furnaces, here three furnaces in each chamber, furnaces 18, 20, 22 in chamber 14 and furnaces 24, 26, 28 in chamber 16. Each of the furnaces here are MBE furnaces, although other types of furnaces are acceptable.

The chamber 14 is designed to grow layers of materials on the wafer 12. The furnaces 18, 20, and 22 in the first chamber 14 are designed to help grow a film, here a III-V film of gallium arsenide, on a surface of a single crystal substrate as part of the wafer 12 by MBE. Thus, the chamber 14 includes appropriate furnaces 18 and 20 for heating gallium and arsenic respectively to provide gallium and arsenic vapors. The vapors are directed through crucibles 19 and 21 of the furnaces 18 and 20, respectively, toward the surface of the wafer 12. A resistive coil 42 disposed beneath the wafer 12 can be used to heat the wafer 12. The coil 42 can be activated, e.g., by passing electricity through the coil 42 to cause the coil to heat the wafer 12 by radiation. The coil 42 can heat the wafer 12 to temperatures of at least about 560° C. Also, the electricity flowing through the coil 42 can be reduced and the wafer 12 cooled to temperatures below 350° C. With the wafer below about 350° C., indium and arsenic can be deposited on the wafer 12 by furnaces 22 and 20, respectively, with indium and arsenic vapors being directed at the wafer 12 through crucibles 23 and 21 of furnaces 22 and 20, respectively. The wafer 12 need not be cooled to deposit the indium and arsenic on the wafer 12 if the film grown on the substrate was grown at a temperature at the desired temperature for depositing the indium and arsenic. Alternatively, the electricity flowing through the coil 42 can be increased to heat the wafer 12 if the film grown on the substrate was grown at a temperature below the desired temperature for depositing the indium and arsenic.

The second chamber 16 is designed to heat the wafer 12 to temperatures of approximately 650° C. and to deposit layers of other materials onto the wafer 12. For example, a resistive coil 44 disposed under the wafer 12 in the chamber 16 can heat the wafer 12 to about 650° C. The furnaces 24, 26, and 28 can heat indium, gallium, and phosphorous to produce indium, gallium, and phosphorous vapors and can direct these vapors at the wafer 12 through crucibles 25, 27, and 29, respectively, to produce an indium gallium phosphide layer. This is exemplary only because, e.g., one or more of the furnaces 24, 26 and 28 could be configured to heat other materials to form layers on the wafer 12. These layers could be of any desired element or combination of elements from the Periodic Table capable of being grown on the wafer 12, including layers other than III-V layers, such as Group II-VI layers and Group IV layers. For example, the furnaces 24 and 26 could supply zinc (Zn) and selenium (Se) to form a zinc selenide layer on the wafer 12.

FIGS. 2A–2D illustrate the wafer 12 at four different stages of processing in the two chambers 14 and 16. As shown, the wafer 12 is placed into the first chamber 14 and a layer of gallium arsenide is deposited on the wafer 12. A layer of indium arsenide is deposited or grown over the layer of gallium arsenide before the wafer 12 is transferred to the second chamber 16. Once transferred to the second chamber 16, the indium arsenide layer is removed and a layer, e.g., of indium gallium phosphide, is deposited or grown on the wafer 12. This process helps to prevent cross-contamination of the wafer 12, e.g., of III-V films with II-VI films.

Figure 2A:
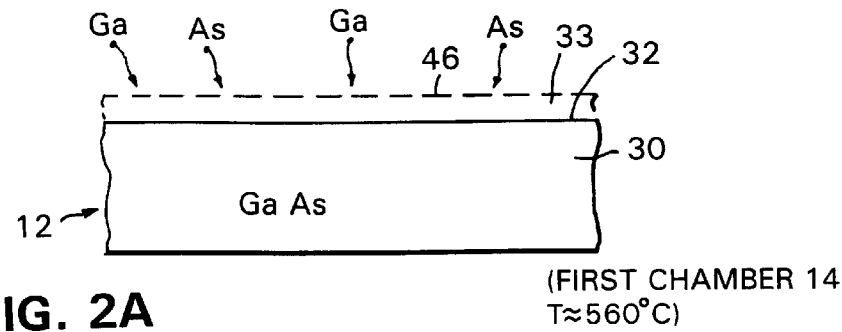
FIGS. 2A–2D are cross-sectional diagrams of a wafer during four stages of manufacture.

As shown in FIG. 2A, the wafer 12, here a single crystal gallium arsenide substrate 30, is placed into the first chamber 14.

While in the first chamber 14, the substrate 30 is heated to a temperature of about 560° C. by actuating the resistive coil 42 (FIG. 1) and gallium and arsenic are directed at a surface 32 of the substrate 30 by the crucibles 19 and 21 of the furnaces 18 and 20 (FIG. 1). The gallium and arsenic vapors are adsorbed onto the surface 32 to grow a layer 33, shown in dashed lines, of gallium arsenide on the wafer 12. The layer 33 can be grown to a desired specification.

Once the gallium arsenide layer 33 is of a desired thickness, the coil 42 (FIG. 1) is controlled to, if needed, change the temperature of the wafer 12 in preparation for depositing an indium arsenide layer on the wafer 12. If the layer 33 was grown at a temperature at or below the temperature desired for growing the next layer, then the temperature of the wafer 12 would not need to be changed, or would need to be increased. This would be the case if, for example, the layer 33 was indium antimonide and the next layer to be grown was indium arsenide. In the example shown in FIGS. 2A–2D, the temperature of a surface 46 of the wafer 12 is cooled to a temperature between about 100° C. and 350° C., and preferably between about 300° C.–350° C. During the cooling time, due to the volatility of arsenic, arsenic is directed at the wafer 12 through the crucible 21 of the furnace 20 (FIG. 1) to maintain the arsenic content of the layer 33. The time required to cool the surface 46 from about 560° C. to less than about 350° C. is typically less than about 10 minutes. Due to the shorter time to cool the surface 46 compared to applying an arsenic protective coating, fewer impurities from the chamber 14 will collect on the surface 46 compared to applying an arsenic protective coating on the wafer 12.

Figure 2B:
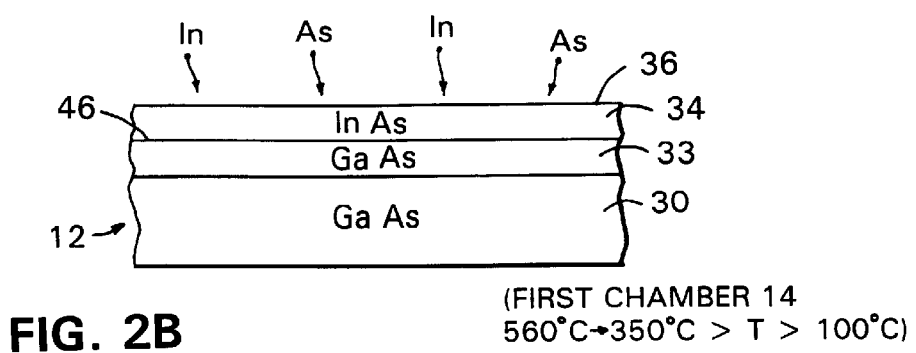

As shown in FIG. 2B, when the temperature of the surface 46 is between about 100° C. and about 350° C., the process enters a second stage where an indium arsenide layer 34 is deposited or grown on the wafer 12. It has been found that growing the indium arsenide layer 34 to about 50 Å provides a good protective layer for transferring the wafer 12 between the first chamber 14 and the second chamber 16 while not significantly increasing the time required for processing the wafer 12. For example, the indium arsenide layer 34 can be grown to about 50 Å in the chamber 14 in less than about one minute. The deposition of the indium arsenide layer 34 significantly alters the in situ reflection high energy electron diffraction [RHEED] pattern because the lattice constant of the indium arsenide layer 34 is different from the lattice constant of the underlying gallium arsenide layer 33. Because the RHEED pattern is observable by an operator of the MBE machine, this change gives the operator a visual confirmation that the coating process has occurred. The wafer is cooled, if necessary, to below about 300° C. in preparation for transfer to another chamber.

With the indium arsenide layer 34 about 50 Å thick and the wafer temperature less than about 300° C., the wafer 12 is transferred from the first chamber 14 to the second chamber 16 as illustrated in FIG. 1. The layer 34 is exposed to the surroundings during this transfer and inhibits impurities from the surroundings from undesirably collecting on or doping the gallium arsenide layer 33. During transit, a film 50 (FIG. 2C) of impurities, e.g., oxygen, silicon, and carbon, adsorbs onto a surface 36 of the indium arsenide layer 34. The impurities, e.g., oxygen that adsorbs onto the indium arsenide layer 34, that could not be removed by outgassing if it had adsorbed onto the gallium arsenide layer 33, can be removed by desorbing the indium arsenide layer 34.

Figure 2C:
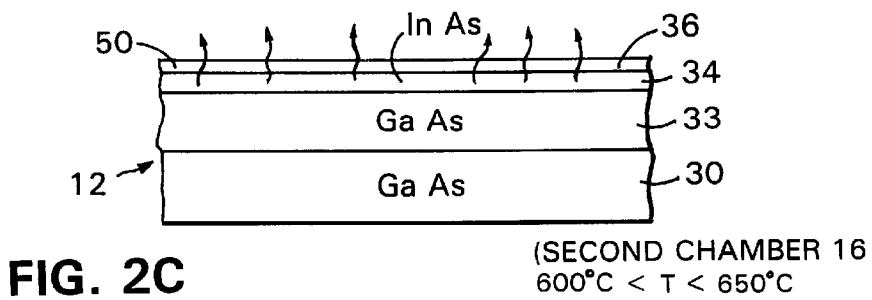

FIG. 2C illustrates the next stage of the processing of the wafer 12. As shown, the wafer 12 has been put into the second chamber 16. The wafer 12 is heated by actuating (passing current through) the coil 44 (FIG. 1) until the surface 36 of the indium arsenide layer 34 reaches a temperature of about 600–650° C. This desorbs the indium arsenide layer 34, to remove substantially all, if not all, of the indium arsenide layer 34 and the impurity film 50 grown on the indium arsenide protective layer 34. If the temperature of the indium arsenide layer 34 is about 650° C., the indium arsenide layer 34 can be desorbed in about 1–2 minutes. Lower temperatures, however, with corresponding longer desorption times, can be used. During this desorption, the impurity layer 50 and the contamination deposited on the indium arsenide layer 34 during transfer from the first chamber 14 to the second chamber 16 is lifted off of the wafer 12. When the indium arsenide layer 34 is lifted off, the RHEED pattern of the wafer 12 recovers to the single crystal pattern of the underlying gallium arsenide film 33, giving the MBE machine operator a visual confirmation of the desorption process.

Figure 2D:
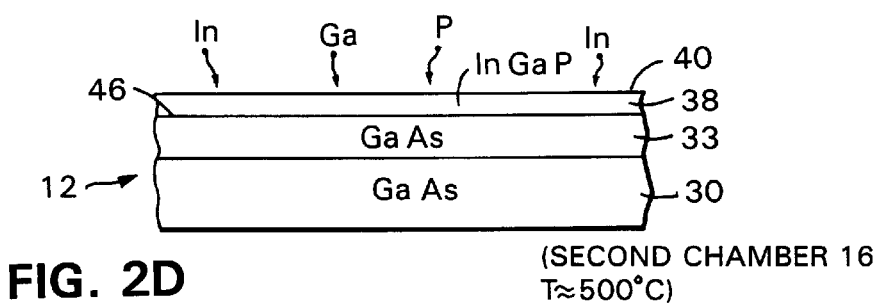

As shown in FIG. 2D, once the indium arsenide layer 34 is desorbed, another layer 38, here of indium gallium phosphide, is grown on the gallium arsenide layer 33. The coil 44 (FIG. 1) heats the wafer 12 until the surface 46 reaches a temperature of approximately 500° C. The indium gallium phosphide layer 38 is grown on the gallium arsenide layer 33 using the furnaces 24, 26, and 28 (FIG. 1). The furnaces 24, 26, and 28 respectively heat indium, gallium, and phosphorous contained in the furnaces 24, 26, and 28 to produce indium, gallium and phosphorous vapors. The vapors are directed at the surface 46 through crucibles 25, 27, and 29 (FIG. 1) to grow the indium, gallium, phosphide layer 38. The layer 38 is grown until its surface 40 is displaced a desired distance from the top 46 of the gallium arsenide layer 33.

Figure 2E:
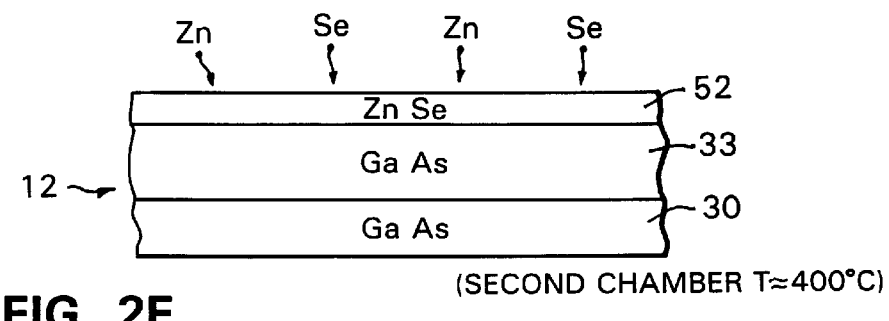
FIG. 2E is a cross-sectional diagram of a wafer during an alternative stage of manufacture.

As shown in FIG. 2E, a zinc selenide layer 52 can be deposited on the gallium arsenide layer 33 instead of the indium gallium phosphide layer 38 shown in FIG. 2D. In this case, the wafer 12 is heated to about 400° C. in the second chamber 16 and the furnaces 24 and 26 (FIG. 1) emit vapors of zinc and selenium to form the zinc selenide layer 52 on the gallium arsenide layer 33.

Figure 3:
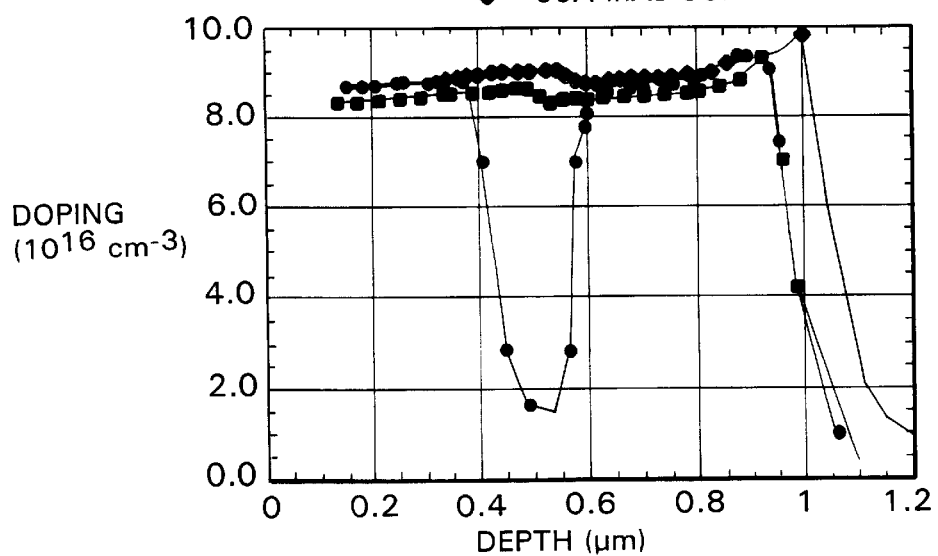
FIG. 3 is a doping versus depth plot for three different wafers.

FIG. 3 illustrates some of the benefits achievable using the invention. FIG. 3 shows the doping concentration versus depth of three different wafers. One wafer was transferred between two chambers without providing a protective layer to inhibit contamination. Another wafer had a protective layer of arsenic deposited on its surface before being transferred between chambers. A third wafer had a 50 Å indium arsenide protective coating deposited on the surface of the wafer before transferring the wafer between chambers. The wafer without any coating exhibited significant doping loss at the depth in the wafer corresponding to the surface exposed to the atmosphere during transfer between chambers. Secondary ion mass spectrometry (SIMS) analysis of the wafer confirmed that the contamination causing the doping loss was primarily oxygen that was not removed when the wafer was outgassed in the second chamber. The two wafers with the protective coatings did not exhibit the doping loss exhibited by the unprotected wafer. Thus, the 50 Å indium arsenide coating 34 (FIGS. 2B–2C) effectively inhibited contamination of the wafer 12 during transfer between chambers 14 and 16 while requiring much less time to cool the wafer 12, much less arsenic consumption, and much less time to deposit the indium arsenide coating 34 than is required to deposit an arseniconly protective coating.

Other embodiments are within the scope of the claims. For example, the surface 32 of the gallium arsenide layer 33 (FIG. 2A) can be adjusted to temperatures as high as about 400–450° C. for depositing the indium arsenide coating 34 (FIG. 2B). More or fewer than three furnaces can be provided in either the first chamber 14 and/or the second chamber 16 for forming layers on the wafer 12. Layers of materials other than those shown in FIGS. 2D and 2E could be grown on the gallium arsenide layer 33. Also, layers of materials other than gallium arsenide could be grown on the substrate 30, which also could be made of a material other than gallium arsenide.

What is claimed is:

1. A method comprising:

depositing a layer of a first material on a single crystal substrate in a first chamber, the layer having a surface;

depositing a second material over the surface of the layer in the first chamber at a temperature above 100° C., the second material including one or more elements each of which is in a Periodic Table group of an element in the first material; and heating the second material in a second chamber to substantially remove the second material.

2. The method recited in claim 1 wherein the first material comprises a III-V compound and the second material comprises indium arsenide.

3. A method of processing a wafer and protecting the wafer from impurities, the method comprising:

growing a III-V layer in a first chamber on a substrate;

depositing an indium arsenide layer on the III-V layer in the first chamber;

heating the indium arsenide layer in a second chamber to desorb the indium arsenide layer; and growing another layer on the III-V layer in the second chamber.

4. The method recited in claim 3 wherein the another layer comprises any desired element or combination of elements from the Periodic Table capable of being grown on the III-V layer.

5. The method recited in claim 4 wherein the another layer comprises a II-VI compound.

6. The method recited in claim 5 wherein the another layer comprises zinc selenide.

7. The method recited in claim 3 wherein the III-V layer is grown at a first temperature and the indium arsenide layer is deposited at a second temperature.

8. The method recited in claim 7 wherein the second temperature is lower than the first temperature and above 100° C.

9. The method recited in claim 8 further comprising depositing arsenic onto the III-V layer while changing the temperature from the first temperature to the second temperature.

10. The method recited in claim 3 wherein the indium arsenide layer is deposited to a thickness of about 50 Å.

11. The method recited in claim 10 wherein the indium arsenide layer is desorbed at a temperature between about 600° C. and about 650° C.

12. A method of fabricating a wafer, the method comprising:

growing a single crystal layer comprising a III-V compound in a first chamber at a first temperature over a substrate;

depositing an indium arsenide layer over the single crystal layer, to form an intermediate structure, in the first chamber at a second temperature lower than the first temperature and above 100° C.;

transferring the intermediate structure to a second chamber; and desorbing the indium arsenide layer in the second chamber at a third temperature greater than the second temperature.

13. The method recited in claim 12 further comprising growing a II-VI compound over the single crystal layer in the second chamber.

14. A method of fabricating a wafer, the method comprising:

growing a single crystal layer comprising a III-V compound in a first chamber at a temperature above 350° C.;

reducing a temperature of a surface of the single crystal layer to below about 350° C. in the first chamber;

depositing an indium arsenide layer on the single crystal layer, to form an intermediate structure, in the first chamber at a temperature below 350° C. and above 100° C.;

transferring the intermediate structure to a second chamber;

heating a surface of the intermediate structure to a temperature above about 600° C. to remove substantially all of the indium arsenide layer and impurities collected in the indium arsenide layer during the transfer to the second chamber; and depositing another material on the single crystal layer in the second chamber.

15. The method recited in claim 14 wherein the indium arsenide layer is deposited at a temperature above 300° C.

16. The method recited in claim 14 wherein the indium arsenide layer is deposited to a thickness of about 50 Å.

17. The method recited in claim 14 wherein the another material comprises any desired element or combination of elements from the Periodic Table capable of being grown on the III-V compound.

18. The method recited in claim 17 wherein the another material comprises a II-VI compound.

19. The method recited in claim 5 wherein the another material comprises zinc selenide.

* * * * *

UNITED STATES PATENT AND TRADEMARK OFFICE
CERTIFICATE OF CORRECTION

PATENT NO.   : 6,368,983 B1
DATED        : April 9, 2002
INVENTOR(S)  : Hoke et al.

It is certified that error appears in the above-identified patent and that said Letters Patent is hereby corrected as shown below:

Title page,
Item [57], ABSTRACT,
Line 5, delete "350°C." and replace with -- 350°C --.
Line 8, delete "350°C." and replace with -- 350°C --.
Line 11, delete "600°C." and replace with -- 600°C --.

Column 1,
Line 63, delete "100°C." and replace with -- 100°C --.
Line 63, delete "560°C." and replace with -- 560°C --.

Column 2,
Line 20, delete "350°C." and replace with -- 350°C --.
Line 23, delete "350°C." and replace with -- 350°C --.
Line 26, delete "600°C." and replace with -- 600°C --.
Line 41, delete "100°C.," and replace with -- 100°C, --.

Column 3,
Line 5, "560°C.," and replace with -- 560°C, --.
Line 62, "350°C.," and replace with -- 350°C, --.

Column 4,
Line 8, delete "650°C." and replace with -- 650°C --.
Lines 41 and 65, delete "560°C." and replace with -- 560°C --.
Line 60, delete "C. and 350°C.," and replace with -- C and 350°C --.
Line 60, delete "300°C.-" and replace with -- 300°C- --.
Line 65, delete "560°C." and replace with -- 560°C --.

Column 5,
Line 5, delete "100°C." and replace with -- 100°C --.
Line 5, delete "350°C." and replace with -- 350°C --.
Line 22, delete "300°C." and replace with -- 300°C --.
Line 25, delete "300°C.," and replace with -- 300°C --.
Line 47, delete "650°C.," and replace with -- 650°C, --.

Column 6,
Line 10, delete "400°C." and replace with -- 400°C --.
Line 37, delete "arseniconly" and replace with -- arsenic-only --.
Line 56, delete "100°C.," and replace with -- 100°C, --.

Column 7,
Line 29, delete "600°C." and replace with -- 600°C --.
Line 39, delete "100°C.;" and replace with -- 100°C; --.

UNITED STATES PATENT AND TRADEMARK OFFICE
CERTIFICATE OF CORRECTION

PATENT NO. : 6,368,983 B1
DATED : April 9, 2002
INVENTOR(S) : Hoke et al.

It is certified that error appears in the above-identified patent and that said Letters Patent is hereby corrected as shown below:

<u>Column 8,</u>
Line 10, delete "350°C.;" and replace with -- 350°C; --.
Lines 13 and 16, delete "350°C." and replace with -- 350°C --.
Line 17, delete "100°C.;" and replace with -- 100°C; --.
Line 22, delete "600°C." and replace with -- 600°C --.

Signed and Sealed this

Twenty-eighth Day of January, 2003

JAMES E. ROGAN
*Director of the United States Patent and Trademark Office*